United States Patent [19]

Green

[11] 4,251,744
[45] Feb. 17, 1981

[54] PULSE CONVERSION CIRCUIT

[75] Inventor: Walter K. Green, Gilroy, Calif.

[73] Assignee: General Electric Company, San Jose, Calif.

[21] Appl. No.: 931,252

[22] Filed: Aug. 4, 1978

Related U.S. Application Data

[60] Continuation of Ser. No. 827,446, Aug. 25, 1977, abandoned, which is a division of Ser. No. 708,281, Jul. 23, 1976, Pat. No. 4,092,539.

[51] Int. Cl.² .................. H03K 5/153; H03K 5/00
[52] U.S. Cl. .................................. 307/362; 307/261
[58] Field of Search ............ 307/354, 362, 363, 261; 328/115–117, 147, 149, 127, 151

[56] References Cited

U.S. PATENT DOCUMENTS

| 2,978,615 | 4/1961 | Chater | 307/362 X |
| 3,553,486 | 1/1971 | Dow | 307/218 X |
| 3,579,094 | 5/1971 | Jorgensen | 307/362 X |
| 3,694,668 | 9/1972 | Foerster | 307/362 X |
| 3,857,047 | 12/1974 | Knight | 307/362 X |

Primary Examiner—John Zazworsky
Attorney, Agent, or Firm—Ivor J. James, Jr.; Samuel E. Turner; Sam E. Laub

[57] ABSTRACT

A pulse conversion circuit which converts input voltage pulses to current pulses, compares the resulting current pulses to a threshold current and produces an output voltage proportional to the integrated difference between the current pulses and the threshold current.

1 Claim, 5 Drawing Figures

Resistance in ohms
Capacitance in microfarads

4,251,744

PULSE CONVERSION CIRCUIT

This is a continuation of application Ser. No. 827,446, filed Aug. 25, 1977, now abandoned which in turn is a divisional of application Ser. No. 708,281, filed July 23, 1976, now U.S. Pat. No. 4,092,539.

BACKGROUND

With expanding utilization of radioactive materials, in the medical, scientific, and industrial fields and the like, there is continuing need for improved equipment for detecting and monitoring radiation emanating from such materials.

Radiation is a potential health hazard, therefore, maximum permissible levels of exposure by humans to radiation are established by various commissions and Governmental regulations. It is thus necessary to monitor areas of potentially high radiation levels to avoid undue exposure. Also, the detection of radiation can be a valuable aid to monitoring the operation of equipment containing radioactive material. For example, an increase in the detected radiation level in the environment adjacent a system containing radioactive materials may indicate leakage from the system before such leakage can be detected by other means.

An example of industrial use of radioactive material is a nuclear reactor power plant. In the water-cooled version of a nuclear reactor in common use, water is heated by passage through a core of nuclear fuel contained in a pressure vessel and steam thus produced is applied to a turbine-generator to produce electrical power. The pressure vessel is contained in a thick-walled cavity or "dry-well" which in turn is surrounded by a containment building. Such nuclear reactor systems are discussed, for example, by M. M. El-Wakil in "Nuclear Power Engineering", McGraw-Hill Book Company, 1962.

In such nuclear reactor plants there are many areas where radiation monitoring is desired and/or required, for example, in the dry-well, in areas occupied by humans for operation or maintenance, in ventilation and off-gas ducts or stacks.

There are a number of types of radiation including gamma rays and alpha and beta particles. Such radiation is potentially harmful to living matter because of its capability of ionizing such matter. The damaging effect of radiation depends on many factors including the type, energy and time distribution of the energy. Thus there are several aspects of radiation of potential interest. One aspect of radiation is the number of radiation events or particles per unit time. Another aspect of radiation is the energy of the radiation either cumulatively or as a rate. A related aspect is the relative biological effectiveness (i.e. the effect on living tissue) of the radiation. The relative biological effectiveness is the ratio of the biological dose (expressed in units called rems) to the energy absorbed per gram of tissue (expressed in units called rads—one rad being equal to 100 ergs per gram).

Various devices for detecting radiation and measuring the various aspects thereof, such as count rate, dose rate, pulse height distribution, etc., are known as discussed, for example, by W. J. Price in "Nuclear Radiation Detection", McGraw-Hill Book Company, 1964.

However, particularly for monitoring radiation in systems such as nuclear power plants, there is a continuing need for a radiation monitor which will detect radiation and directly provide simultaneous measurements of the dose rate, concentration and average energy of the radiation from the atmosphere being monitored.

Thus an object of the invention is to provide an improved radiation monitor.

Another object of the invention is a radiation monitor providing indications of the dose rate, concentration and energy of radiation detected by a single radiation detector.

Another object of the invention is to provide a pulse conversion circuit responsive to input pulses of varying amplitude to provide an output signal proportional to the integrated energy of the input pulses.

SUMMARY

The foregoing and other objects of the invention are achieved by passing samples of a radioactive fluid, such as gas, from an atmosphere to be monitored, through a flow cell or chamber containing a radiation detector such as a scintillation detector-photomultiplier arrangement, the detector arrangement being responsive to radiation events from the fluid to produce detector output pulses.

A first channel or circuit connected to receive the detector output pulses is responsive to the rate of the pulses to provide an output signal which is a measure of or proportional to the activity concentration or specific activity (disintegrations per unit time per unit volume) in the radioactive fluid in the flow cell.

A second channel or circuit connected to receive the detector output pulses is responsive to the integrated energy of the pulses to produce an output signal which is a measure of or proportional to the dose rate (rems per unit time) of the radiation from the radioactive fluid in the flow cell. This second channel includes a pulse conversion circuit which converts the varying amplitude detector output voltage pulses to current pulses, compares these current pulses to a threshold current and produces an output voltage proportional to the integrated difference between the current pulses and the threshold current.

A third channel or circuit is connected to receive the output signals from the first and second circuits and is responsive thereto to provide an output signal which is a measure of or proportional to the average energy of the radiation from the radioactive fluid in the flow cell.

DRAWING

The invention is described more specifically hereinafter with reference to the accompanying drawing wherein.

DESCRIPTION

While the radiation monitor arrangement of the invention is of general usefulness wherever the simultaneous output signals provided thereby are desirable, the embodiment of the invention illustrated and described herein by way of example is especially useful for monitoring predominately the beta radiation from, for example, argon, krypton and Zenon gases in the various regions of a nuclear reactor power plant.

Figure 1:
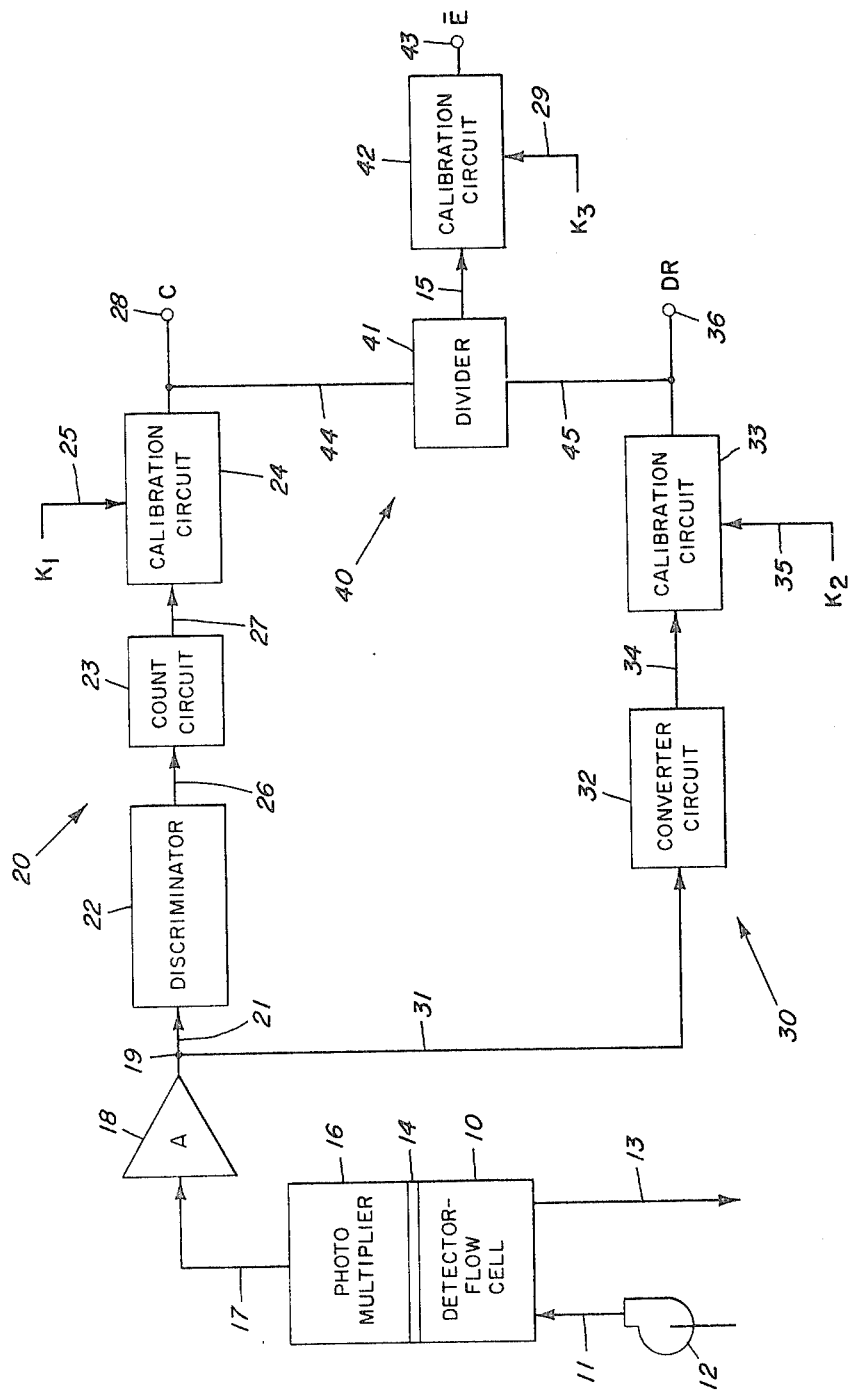
FIG. 1 is a block diagram of the radiation monitoring system of the invention.

The radiation monitor system of the invention is illustrated in schematic form in FIG. 1. A continuous stream of the fluid to be monitored for radiation, for example, a gas such as air which may contain radioactive gas, is applied to a detector-flow cell or chamber 10 through an input conduit 11 by a pump 12 which maintains a substantially constant pressure of the gas in the flow cell 10. The gas exits the flow cell 10 via a conduit 13. A specific embodiment of a flow cell is described hereinafter with reference to FIG. 2.

Radiation from the gas in the flow cell 10 is detected by a radiation detection element in the form of an optically transparent or translucent scintillator element 14 positioned within the flow cell. The scintillator element 14 absorbs the radiation particles or rays and converts at least a portion of the energy thereof to light energy or scintillations.

The scintillations or flashes of light from the scintillator element 14 are suitable coupled to the photocathode of a photomultiplier 16. The light flashes cause a release of electrons in the photocathode. The thus released electrons are multiplied in the multiplier portion of the photomultiplier whereby detector output pulses are produced in response to the radiation events in the flow cell 10 on a lead 17. Lead 17 is connected to the input terminal of a well-known amplifier 18 whereby the detector output pulses are available in amplified form at an output terminal 19. (Scintillation detectors are discussed in greater detail in chapter 7 of the previously mentioned Price publication.)

The detector output pulses on terminal 19 are applied to two different pulse processing channels. A first channel 20 is connected by a lead 21 to terminal 19 and comprises an analyzer or discriminator 22, a count rate circuit 23 and a calibration circuit 24 interconnected by leads 26 and 27. When suitably calibrated by a signal $K_1$ on a lead 25 (as discussed hereinafter) the channel 20 produces an output signal on an output terminal 28 which is a measure of the concentration C of the radioactivity in the radioactive gas in the flow cell 10 expressed as radiation events or disintegrations per unit time per unit volume of the gas, for example, as disintegrations per minute per milliliter or dpm/ml. (This output signal is also a measure of the specific activity S of the radiation in the gas in flow cell 10 expressed as, for example, microcuries per gram of the gas.)

The second channel 30 is connected by a lead 31 to terminal 19 and comprises a pulse conversion circuit 32 and a calibration circuit 33 interconnected by a lead 34. When suitably calibrated by a signal $K_2$ on a lead 35 (as discussed hereinafter) the channel 30 produces an output signal DR on an output terminal 36 which is a measure of dose rate of the radiation from the radioactive gas in the flow cell expressed as, for example, millirems per hour on mr/hr.

A third channel 40, formed by a divider circuit 41 and a calibration circuit 42 interconnected by a lead 15, receives the output signals C and DR from the channels 20 and 30 over leads 44 and 45. When suitably calibrated by a signal $K_3$ on a lead 29 (as discussed hereinafter) the channel 40 produces an output signal $\bar{E}$ at a terminal 42 which is proportional to the ratio of the signal DR to the signal C and is thus a measure of average absorbed energy of the radiation from the gas in the flow cell 10 (that is, the average radiation energy that would be biologically absorbed upon exposure to a gas having the radioactive composition of the gas in flow cell 10.)

Suitable embodiments of the various components of the radiation monitoring system of FIG. 1 will now be described in greater detail.

Figure 2:
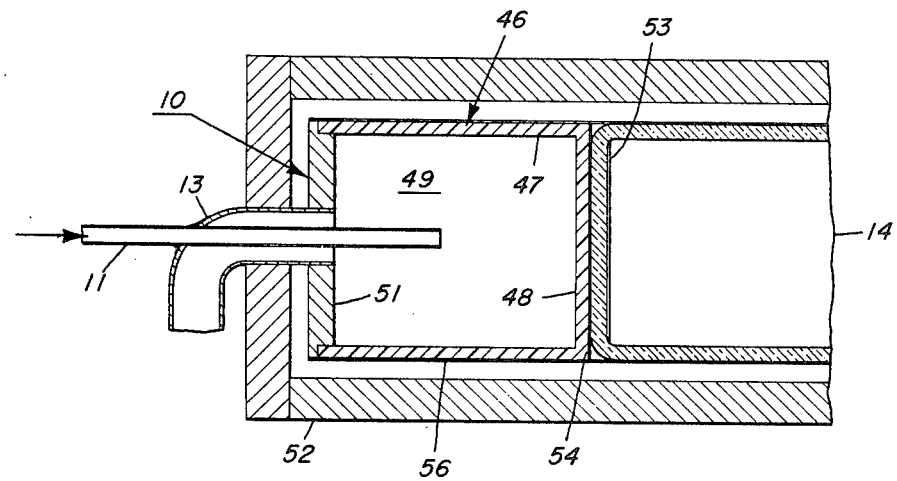
FIG. 2 is a longitudinal cross section illustration of an embodiment of a detector-flow cell-photomultiplier arrangement.

An arrangement of the flow cell 10 and photomultiplier 14 is illustrated in FIG. 2. The basic element of the detector-flow cell 10 is a scintillator member or radiation detector element 46 formed of suitable scintillation material. Member 46 consists of a cylindrical portion 47 and an end portion 48 which thus form a gas receiving space or chamber 49. The other end of the chamber 49 is closed by an end plate 51, formed for example, of aluminum, cemented or otherwise attached to the cylindrical portion 47. Fitted within an aperture of the end plate 51 is the gas outlet conduit 13 through which is coaxially positioned the gas inlet conduit 11 from pump 12 (FIG. 1).

The well-known photomultiplier 14 is positioned so that its face or photocathode 53 closely abuts the end portion 48 of the scintillator member 46. To ensure good optical contact between the photocathode 53 and the end portion 48 a viscous optical coupling material 54 such as a suitable silicone grease may be applied to the abutting surfaces. The flow cell-photomultiplier assembly (including a preamplifier, not shown, which is normally used to amplify the photomultiplier output signals) is covered with a layer 56 of light shielding and reflecting material such as aluminum foil. The entire assembly is preferably enclosed in a radiation shield structure 52 formed of heavy material such as lead to reduce entrance of background radiation.

It is desirable that the scintillation material, from which the scintillator member 46 is formed, have a response to radiation similar to the radiation response of living tissue. In this manner, the integrated energy of the signal from detector element 46 is proportional to the dose rate. Plastic scintillator materials are found to have such a radiation response. (Examples of suitable scintillator materials include plastic scintillators Nos. NE 102 and NE 105 offered by Nuclear Enterprises, Inc., San Carlos, California.)

The described detector-flow cell 10 is designed for high efficiency, high beta radiation sensitivity and for low sensitivity to gamma radiation. Detection efficiency is found to be in the order of 85 percent and the ratio of gamma response to beta response is about one to twenty. The scintillator member 46 is about 6.35 cm in outside diameter and its length, including end portion 48, is about 5.08 cm with a wall thickness of about 0.317 cm. This provides an effective flow cell volume of about 97 cm$^3$. Other detector-flow cell configurations and materials can be used with the system depending upon the results desired. For example, response to gamma radiation can be increased by increasing the thickness of the scintillator material.

The discriminator or analyzer circuit 22 is in essence an amplifier, having threshold, limiting and pulse shaping capability, which receives the varying amplitude and variably shaped pulses from amplifier 18 and is responsive thereto to produce output pulses on lead 26 of a predetermined standard shape and amplitude. For operation in the present system, the input threshold of analyzer circuit 22 is adjusted to above the noise amplitude to thereby reject signals that cannot be distinguished from noise, and the pulse shaping circuits are adjusted to provide the amplitude and shape of output signals on lead 26 appropriate as input signals to count rate circuit 23. (For some applications it may be desirable to adjust the threshold to discriminate against low level radiation pulses.) A number of known circuits are suitable for use as analyzer circuit 22 an example of which is Single Channel Analyzer Model TC 214 available from Tennelec Instrument Company, Inc., Oak Ridge, Tennessee.

The count rate circuit 23 may be any of the well known circuits which produce an analog output signal on lead 27, the amplitude of which is proportional to rate of receipt of input pulses on lead 26. Such count rate circuits, as well as amplifier, discriminator, pulse shaping circuits and the like, are discussed in the aforementioned Price publication and in references cited therein.

The pulse conversion circuit 32 is a special circuit which provides an analog output signal on lead 34, the amplitude of which is proportional to the integrated energy of the input pulses on lead 31. Since the plastic scintillator or detector 46 (FIG. 2) provides a radiation response similar to living tissue and since the energy of the detector output signals is closely proportional to the energy lost by the incident beta particles, the analog output signal on lead 34 is proportional to the biological dose rate.

Figure 3:
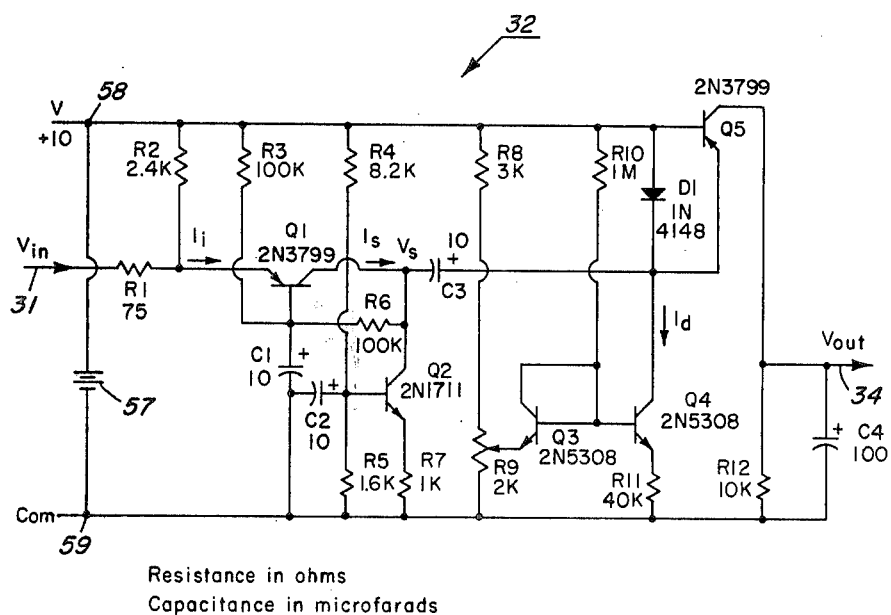
FIG. 3 is a schematic diagram of a pulse converter circuit.

A schematic diagram of the pulse conversion circuit 32 is shown in FIG. 3 together with example component types and values. This circuit receives the pulses on lead 31 from amplifier 18 and performs three basic functions, namely, voltage to current transformation, current discrimination, and current integration whereby a voltage $V_{out}$ on lead 34 is proportional to the integrated energy of the input pulses on lead 31. The circuit 32 is powered by a suitable d-c power source illustrated as a battery 57 connected between a positive line 58 and a negative or common line 59.

A transistor Q1 is connected as a common base amplifier and it serves as a voltage to current converter whereby its collector current $I_s$ is proportional to the input emitter voltage $V_{in}$. Resistor R1 determines the conversion factor ($V_{in}/R1 = I_i$) and it can be selected to act as a cable terminator for the lead or cable 31.

Transistor Q2 functions as a constant current source to provide d-c biasing for transistor Q1 and to provide a high impedance load for the collector of transistor Q1. Resistors R4, R5 and R7 determine the current through transistor Q2 and the quiescent current through transistor Q1 and resistor R2 while resistors R3 and R6 determine the common d-c collector voltage for transistors Q1 and Q2. Capacitors C1 and C2 are bypass capacitors which provide low a-c impedances at the bases of transistors Q1 and Q2.

Transistors Q3, Q4 and Q5 and associated components constitute a current discriminator or threshold circuit. A resistor R8 and a variable resistor R9 comprise a voltage divider and the setting of resistor R9 determines (through transistor Q3) the voltage at the base of transistor Q4 which in turn determines the quiescent current through transistor Q4, diode D1 and resistor R11. The ratio of resistor R8 to resistor R9 determines the range of current discrimination adjustment. Transistor Q3 provides temperature compensation for transistor Q4 and resistor R10 supplies base current to transistor Q4.

A capacitor C4, connected to the collector of transistor Q5 acts as a current integrator with a parallel connected resistor R12 controlling the averaging time constant.

Operation of the converter circuit 32 is as follows: Initially the diode D1 is forward biased by the current $I_d$. When a pulse of positive polarity is received on the input line 31, it is converted to a current $I_s$ at the collector of transistor Q1. The current $I_s$ is coupled to diode D1 and transistors Q4 and Q5 by a capacitor C3 whereby the current $I_s$ is, in effect, compared to the current $I_d$. When the current $I_s$ becomes equal to the current $I_d$ (as set by resistor R10) the voltage $V_s$ (at the collector of transistor Q1) begins to rise causing diode D1 to become back biased and causing transistor Q5 to conduct. Thus the amount of the current $I_s$ that is in excess of the current $I_d$ is conducted through transistor Q5 to the integrating capacitor C4. Variable resistor or potentiometer R9 can be adjusted to provide a circuit response threshold which is, for example, above the level of noise pulses. The result of this circuit operation is a voltage output $V_{out}$ across integrating capacitor C4 on lead 34 which is proportional to both the number of pulses whose level exceeds the discrimination level and to the amplitude of these pulses.

Figure 4:
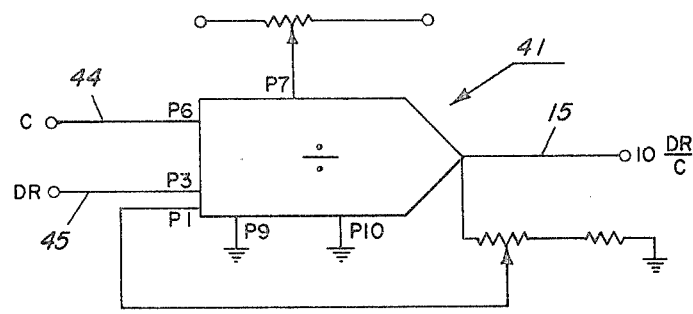
FIG. 4 is a block illustration of an embodiment of a divider circuit.

Divider circuit 41 may be any well-known circuit which provides an output voltage that is porportional to the ratio of two input voltages. For example, a suitable circuit for this use is Burr-Brown Multiplier-Divider Model 4205 available from Burr-Brown Research Corporation, Tuscon, Arizona. An example of such a circuit, connected as a two-quadrant divider of the two analog voltage input signals C and Dr is shown in FIG. 4. As indicated, this circuit provides an output voltage on the lead 15 equal to ten times the ratio of the input voltages DR to C. (A resistive voltage divider can be added to convert the output signal to the ratio DR/C if desired.) (The numbers P1, P3, etc. are the pin numbers of the Model 4205 circuit.)

Calibration circuits 24, 33 and 42 may comprise any suitable circuit such as a gain controlled amplifier, a divider or multiplier which provides means for linearly modifying the channel voltages on leads 15, 27 and 34 by selected calibration constants $K_3$, $K_1$ and $K_2$, respectively.

Figure 5:
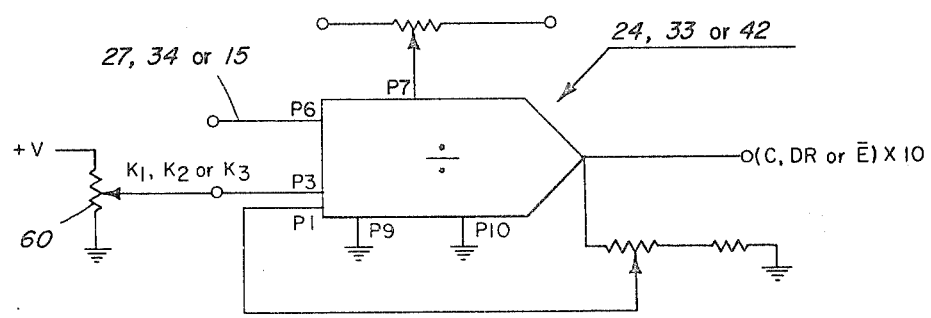
FIG. 5 is a block illustration of an embodiment of the calibration circuits of the system of FIG. 1.

Conveniently, the calibration circuits 24, 33 and 42 may be divider circuits such as the Burr-Brown Model 4205 discussed hereinbefore. A suitable adaptation of this circuit for this purpose is shown in FIG. 5. Lead 24, 35 or 15, as the case may be, is connected to the dividend input (P6) of the divider circuit. A potentiometer 60, connected as an adjustable divider of a supply voltage (indicated as +V) serves as a source of the calibration signals $K_1$, $K_2$ or $K_3$ applied to the division input (P3) of the divider circuit.

The radiation monitoring circuit can be calibrated by circulating samples of known radioactive gases of interest through the flow cell 10. Such gas samples can be prepared by known methods and the radiation characteristics thereof accurately can be determined by known laboratory means. The potentiometers 60 of the calibration circuits 24, 33 and 42 can then be adjusted to set the levels of calibration signals $K_1$, $K_2$ and $K_3$ to provide the amplitude of output signals C, DR and $\overline{E}$ on output terminals 28, 36 and 43 appropriate to the known radiation characteristics of the sample gas. These output signals on terminals 28, 36 and 43 can, of course, be applied to well-known indicating and/or recording equipment (not shown) such as meters, chart recorders and the like.

The disclosed calibration arrangement provides flexibility in the application of the monitoring system. For example, it may be desirable for some applications to measure the radioactivity of a stream of gas at a certain point while providing indications of the activity concentration, dose rate and/or average energy resulting from this gas at some other point. For example, in monitoring the gases released to the atmosphere from a nuclear reactor it may be desirable to sample the gases in the off-gas stack while providing an indication of, for example, the resulting dose rate at the reactor site boundaries some distance away. This can be accomplished by applying a calibration signal to the calibration circuit (or to an additional calibration circuit connected in parallel therewith) which is a function of the dispersion of the gases in the surrounding atmosphere, the dispersion being, in turn, a function of meteorological data such as wind velocity, direction, etc. which can be expressed as an analog voltage and applied to the calibration circuit to suitably alter the calibration constant.

What is claimed is:

1. A pulse conversion circuit comprising the combination of: a power supply line connected to one terminal of a power source; a common line connected to the other terminal of said power source; an input line for receiving said voltage pulses; a first transistor, a first resistor connected between said input line and the emitter of said first transistor; a second resistor connected between said supply line and the emitter of said first transistor, a third resistor connected between said supply line and the base of said first transistor; a first capacitor connected between said common line and the base of said first transistor; a second transistor; a fourth resistor connected between said supply line and the base of said second transistor; a fifth resistor connected between said common line and the base of said second transistor; a second capacitor connected between said common line and the base of said second transistor; a sixth resistor connected between the base of said first transistor and the collectors of said first and second transistors; a seventh resistor connected between the emitter of said second transistor and said common line; a third transistor; an eighth resistor and a ninth resistor connected in series between said supply line and said common line, said ninth resistor having an adjustable tap, said tap being connected to the emitter of said third transistor; a fourth transistor; a tenth resistor connected from said supply line to the base and to the collector of said third transistor and to the base of said fourth transistor; a fifth transistor; an eleventh resistor connected between said common line and the emitter of said fourth transistor; a third capacitor connected between the collectors of said first and second transistors and the emitter of said fifth transistor; a first diode connected at one end to said supply line and to the base of said fifth transistor and at its other end to the collector of said fourth transistor and to the emitter of said fifth transistor; a fourth capacitor connected between said common line and the collector of said fifth transistor; and a twelfth resistor connected in parallel with said fourth capacitor.

* * * * *